United States Patent
Bai et al.

(10) Patent No.: US 10,790,407 B2
(45) Date of Patent: Sep. 29, 2020

(54) FABRICATION OF SENSOR CHIP ASSEMBLIES WITH MICROOPTICS ELEMENTS

(71) Applicant: The Boeing Company, Chicago, IL (US)

(72) Inventors: Xiaogang Bai, South Pasadena, CA (US); Rengarajan Sudharsanan, Stevenson Ranch, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 14/452,889

(22) Filed: Aug. 6, 2014

(65) Prior Publication Data
US 2016/0043268 A1    Feb. 11, 2016

(51) Int. Cl.
*H01L 31/02* (2006.01)
*H01L 31/18* (2006.01)
(Continued)

(52) U.S. Cl.
CPC ...... *H01L 31/1876* (2013.01); *H01L 27/1469* (2013.01); *H01L 27/14627* (2013.01); *H01L 27/14634* (2013.01); *H01L 31/02327* (2013.01)

(58) Field of Classification Search
CPC ....... H01L 31/09; H01L 31/18; H01L 31/105; H01L 31/02363; H01L 31/0296; H01L 27/144; H01L 21/187; H01L 21/2007; H01L 21/76251; H01L 33/54; H01L 33/58; H01L 33/48; H01L 33/502; H01L 2924/01322; H01L 2924/12041; H01L 27/146; H01L 27/14625; H01L 27/14623; H01L 27/14634; H01L 27/14643; H01L 27/14636; H01L 27/14607; H01L 27/1462; H01L 27/1469; H01L 27/14685;
(Continued)

(56) References Cited

U.S. PATENT DOCUMENTS 4,127,932 A * 12/1978 Hartman ............... H01L 31/107
                                              257/438
2003/0010978 A1* 1/2003 Burden .................. C30B 19/00
                                               257/49
(Continued)

FOREIGN PATENT DOCUMENTS

EP    1239519 A2    9/2002
JP    2001339057 A  12/2001
(Continued)

OTHER PUBLICATIONS

Funk et al, "Packaging and Qualification of Single Photon Counting Avalanche Photodiode Focal Plane Arrays," SPIE, Advanced Photon Counting Techniques III, vol. 7320, Apr. 2009, 9 pages.
(Continued)

*Primary Examiner* — Natalia A Gondarenko
(74) *Attorney, Agent, or Firm* — Yee & Associates, P.C.

(57) ABSTRACT

A method and apparatus for fabricating sensor chip assemblies. A photodetector wafer and an optics wafer are bonded to each other. Photodetectors are formed on the photodetector wafer. A circuit wafer is bonded to the photodetector wafer that is bonded to the optics wafer after forming the photodetectors on the photodetector wafer.

15 Claims, 7 Drawing Sheets

(51) Int. Cl.
*H01L 27/146* (2006.01)
*H01L 21/00* (2006.01)
*H01L 21/02* (2006.01)
*H01L 31/0232* (2014.01)

(58) Field of Classification Search
CPC ......... H01L 27/14687; H01L 27/14689; H01L 21/682; H01L 21/683187; H01L 2224/32225; H01L 2224/48993; H01L 2224/48998; H01L 2021/60067; H01L 2021/60075; H01L 2223/544; H01L 2223/54426; H01L 2223/5444; H01L 2223/5446; H01L 2223/5448; H01L 2223/54486; H01L 2223/54493; H01L 2223/6661; H01L 2223/6616; H01L 2223/6622; H01L 24/32; H01L 23/544; H01L 23/3114; H01L 2933/0058; H01L 31/0232; H01L 31/02325
USPC ............ 438/31, 72; 257/432, 436, 437, 433, 257/E31.127
See application file for complete search history.

(56) References Cited

U.S. PATENT DOCUMENTS

| | | | |
|---|---|---|---|
| 2007/0207566 A1 | 9/2007 | Fu et al. | |
| 2007/0284685 A1* | 12/2007 | Tanaka | G02B 6/43 257/432 |
| 2008/0070340 A1* | 3/2008 | Borrelli | H01L 21/76254 438/57 |
| 2012/0299143 A1* | 11/2012 | Stern | H01L 27/14625 257/437 |
| 2013/0221469 A1 | 8/2013 | Kim et al. | |
| 2013/0341747 A1 | 12/2013 | Lin et al. | |
| 2014/0099059 A1* | 4/2014 | Pommer | G02B 6/4219 385/33 |
| 2015/0085094 A1* | 3/2015 | Fujimori | H01L 25/042 348/65 |
| 2015/0155270 A1* | 6/2015 | Rossi | H01L 31/0232 362/237 |

FOREIGN PATENT DOCUMENTS

| | | | | |
|---|---|---|---|---|
| JP | 2006237428 A | * | 9/2006 | |
| JP | 2008530801 A | | 8/2008 | |
| JP | 2010506404 A | | 2/2010 | |
| JP | 2012123224 A | * | 5/2012 | .......... H01L 27/146 |
| JP | 2013090127 A | | 5/2013 | |
| JP | 2013125881 A | | 6/2013 | |
| WO | WO 2012158671 A1 | * | 11/2012 | .......... G02B 6/4201 |
| WO | WO2013179766 A1 | | 12/2013 | |

OTHER PUBLICATIONS

Verghese et al., "Arrays of InP-based Avalanche Photodiodes for Photon Counting," IEEE Journal of Selected Topics in Quantum Electronics, vol. 13, No. 4, Jul. 2007, pp. 870-886.
Extended European Search Report, dated Dec. 18, 2015, rgarding Application No. EP15172592.6, 6 pages.
European Patent Office Extended Search Report, dated Oct. 9, 2017, regarding Application No. EP17180338.0, 7 pages.
Japan Patent Office Notice of Reasons for Rejection and English Translation, dated May 13, 2019, regarding Application No. 2015125393, 5 pages.
Japan Patent Office Notice of Reasons for Rejection and English Translation, dated Feb. 3, 2020, regarding Application No. 2015125393, 6 pages.

* cited by examiner

FABRICATION OF SENSOR CHIP ASSEMBLIES WITH MICROOPTICS ELEMENTS

BACKGROUND INFORMATION

1. Field

The present disclosure relates generally to sensor chip assemblies (SCAs) and, in particular, to sensor chip assemblies with optics elements, such as a microlens array. Still more particularly, the present disclosure relates to a method and apparatus for fabricating a microlens array, a sensor array, and a readout integrated circuit (ROIC).

2. Background

Sensor chip assemblies usually have a capability to detect light or other electromagnetic energy. For example, sensor chip assemblies may detect infrared light, visible light, ultraviolet light, x-rays, and other types of electromagnetic energy.

The sensors in sensor chip assemblies may take various forms. For example, sensor chip assemblies may include active pixel sensors, charged coupled devices, photodiodes, or other suitable types of devices.

Oftentimes, sensors in sensor chip assemblies are fabricated in arrays for use in generating information for images. The readout integrated circuit provides direct control on each sensor pixel and reads back the collected signals. Sensor chip assemblies may generate information for still images, videos, timing information and ranging information to construct three dimensional images and videos, or other suitable information.

The sensor chip assemblies may include optics, an array of photodetectors, and circuits that generate signals. For example, each photodetector may represent a pixel. The optics may be used to enhance detection efficiency. The circuits generate signals for the pixels formed by the photodetectors.

As the size of the photodetector and pitch of the photodetector array become smaller, manufacturing the sensor chip assembly with a desired alignment between the different components becomes more challenging.

The alignment between the microoptics, like a microlens array, and the photodetector array is important in obtaining a desired level of optical efficiency of the sensor chip assembly. A misalignment of several microns may result in an undesired degradation in the optical efficiency of a sensor chip array. In some cases, misalignment results in a total loss of signals.

Currently, forming sensor chip arrays involves forming a photodetector wafer. The photodetector wafer is diced into dies. Additionally, a microlens wafer is also formed and diced into dies. Thereafter, each die containing a photodetector array and a corresponding array of microlenses are bonded with epoxy using a bonding machine.

In the bonding process, both passive and active alignments may be used. A passive alignment involves aligning a die with a photodetector array with a die with the microlens array using features located on one or more of these components. An active alignment involves detecting the signal level generated by the photodetector array with respect to different positions of the die with the microlens array and the die with the photodetector array.

The die bonding process is time-consuming and the accuracy is limited by the bonding machine and the operator of the bonding machine. Further, misalignment may occur during the curing of the epoxy.

Therefore, it would be desirable to have a method and apparatus that take into account at least some of the issues discussed above, as well as other possible issues. For example, it would be desirable to have a method and apparatus that reduce alignment issues in forming the photodetectors with the microlens.

SUMMARY

An embodiment of the present disclosure provides a method for fabricating sensor chip assemblies. A photodetector wafer and an optics wafer are bonded to each other. Photodetectors are formed on the photodetector wafer. A circuit wafer is bonded to the photodetector wafer that is bonded to the optics wafer after forming the photodetectors on the photodetector wafer.

Another embodiment of the present disclosure provides a method for fabricating sensor chip assemblies. An avalanche photodiode wafer and an optics wafer are bonded to each other. A group of alignment marks are formed on the optics wafer. Arrays of avalanche photodiodes are formed on the avalanche photodiode wafer using the group of alignment marks on the optics wafer. Contacts are formed on a readout integrated circuit wafer. Contacts are formed on the avalanche photodiode wafer. The readout integrated circuit wafer is bonded to the avalanche photodiode wafer that is bonded to the optics wafer after forming the arrays of avalanche photodiodes on the avalanche photodiode wafer to form a wafer stack. The wafer stack is diced to form individual dies for the sensor chip assemblies.

In yet another illustrative embodiment, a wafer stack comprises a photodetector wafer and an optics wafer bonded to each other, bonding a circuit wafer that is bonded to the photodetector wafer, and photodetectors formed on the photodetector wafer. A group of alignment marks are on the optics wafer.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. For example, the illustrative embodiments recognize and take into account that the currently used process for aligning components is inefficient and results in more misalignment than desired in many cases. Further, the illustrative embodiments recognize and take into account that the currently used process also takes more time and effort than desired, increasing the cost to fabricate sensor chip assemblies.

The illustrative embodiments recognize and take into account that alignment may be performed on a wafer level rather than on a die level, as currently performed. By performing the alignment on a wafer level, a desired level of alignment between different components in a sensor chip assembly may be achieved more easily and with less cost.

Thus, the illustrative embodiments provide a fabrication system for fabricating sensor chip assemblies. In particular, the fabrication system bonds a photodetector wafer and an optics wafer to each other. Photodetectors are formed on the photodetector wafer, a circuit wafer is bonded to the photodetector wafer that is bonded to the optics wafer after forming the photodetectors on the photodetector wafer.

Figure 1:
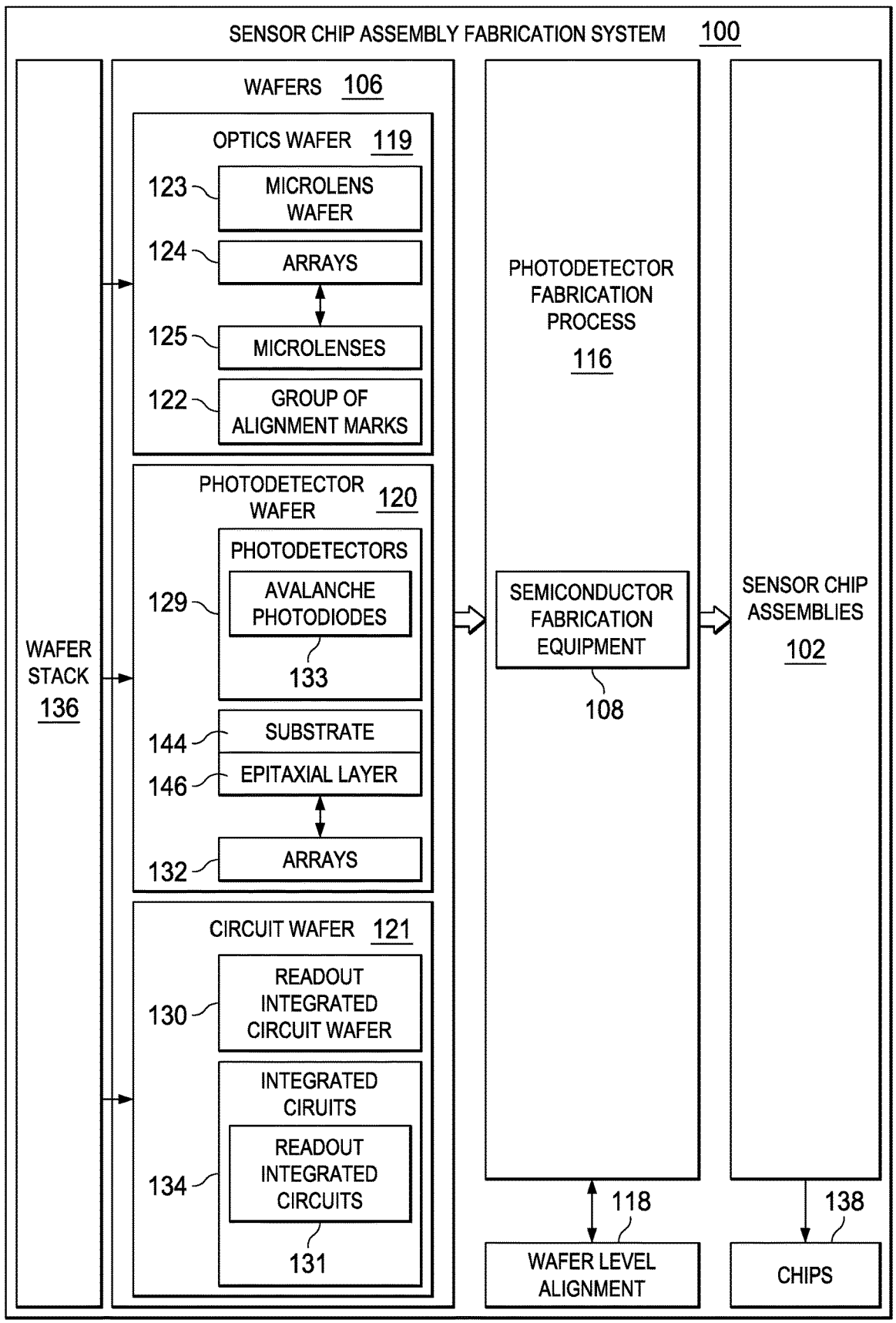
FIG. 1 is an illustration of a block diagram of an integrated circuit fabrication system in accordance with an illustrative embodiment.

With reference now to the figures and in particular with reference to FIG. 1, an illustration of a block diagram of an integrated circuit fabrication system is depicted in accordance with an illustrative embodiment. In this figure, sensor chip assembly fabrication system 100 fabricates sensor chip assemblies 102.

In the illustrative example, semiconductor fabrication equipment 108 processes wafers 106 to form sensor chip assemblies 102. Semiconductor fabrication equipment 108 may include, for example, chemical vapor deposition devices, photoresist systems, electron beam lithography equipment, plasma etching equipment, ion implantation equipment, sputter deposition equipment, wet processing equipment, bonding machines, and other suitable equipment for processing wafers 106.

As depicted, photodetector fabrication process 116 is implemented in sensor chip assembly fabrication system 100 and is performed using semiconductor fabrication equipment 108. Photodetector fabrication process 116 uses wafer level alignment 118 to form sensor chip assemblies 102. In the illustrative example, wafer level alignment 118 reduces misalignment and time needed to fabricate sensor chip assemblies 102.

As depicted, wafers 106 include a number of different types of wafers. For example, wafers 106 may include optics wafer 119, photodetector wafer 120, and circuit wafer 121. Wafers 106 may be in different stages of processing. Some of wafers 106 may be only a substrate. Others of wafers 106 may have some circuits, doping, epitaxial layers, photoresist or other structures.

In the illustrative example, optics wafer 119 has group of alignment marks 122. As used herein, "a group of" when used with reference to items means one or more items. For example, group of alignment marks 122 is one or more alignment marks.

Optics wafer 119 may take the form of microlens wafer 123. Arrays 124 of microlenses 125 are located on optics wafer 119 in this illustrative example. A microlens is a lens with a diameter of less than a millimeter. Oftentimes, the microlens may be as small as 10 micrometers.

Photodetector wafer 120 includes substrate 144 and epitaxial layer 146. Photodetector wafer 120 is ready for forming photodetectors 129 in this illustrative example.

As depicted, circuit wafer 121 includes integrated circuits that receive electrical signals generated by photodetectors 129. For example, circuit wafer 121 may be readout integrated circuit wafer 130 with readout integrated circuits 131. A readout integrated circuit is an integrated circuit that is used to read signals generated by photodetectors 129.

In this illustrative example, photodetector fabrication process 116 uses wafer level alignment 118 in processing wafers 106 to form sensor chip assemblies 102. As depicted, photodetector wafer 120 and optics wafer 119 are bonded to each other.

Photodetectors 129 are formed on photodetector wafer 120 after circuit wafer 121 is bonded to photodetector wafer 120, which has been bonded to optics wafer 119. Photodetectors 129 are formed using group of alignment marks 122. Photodetectors 129 are formed in arrays 132 using group of alignment marks 122. In this illustrative example, photodetectors 129 are avalanche photodiodes 133. When avalanche photodiodes 133 are used, photodetector wafer 120 is an avalanche photodiode wafer in this illustrative example.

As depicted, integrated circuits 134 are formed on circuit wafer 121. Circuit wafer 121 is bonded to photodetector wafer 120 after forming photodetectors 129 on photodetector wafer 120 and after forming integrated circuits 134 on circuit wafer 121. Photodetectors 129 are arranged as arrays 132 of photodetectors 129. In this illustrative example, photodetectors 129 are avalanche photodiodes 133.

These three wafers form wafer stack 136 when bonded to each other. Wafer stack 136 is diced to form sensor chip assemblies 102. These assemblies may be mounted on carriers and placed into packages for use as chips 138. Each sensor chip assembly has a microlens die, a photodetector die, and a readout integrated circuit die that are bonded to each other.

In this illustrative example, sensor chip assemblies 102 fabricated in sensor chip assembly fabrication system 100 may be used in different devices or systems. For example, sensor chip assemblies 102 may be used in at least one of a camera, a motion detector, a LIDAR system, or a telescope.

As used herein, the phrase "at least one of," when used with a list of items, means different combinations of one or more of the listed items may be used and only one of each item in the list may be needed. In other words, at least one of means any combination of items and number of items may be used from the list but not all of the items in the list are required. The item may be a particular object, thing, or a category.

For example, without limitation, "at least one of item A, item B, or item C" may include item A, item A and item B, or item B. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

Photodetector fabrication process 116 operates with whole wafers in wafers 106. Wafers 106 are aligned as a whole rather than dies as in currently used processes for manufacturing sensor chip assemblies 102. Aligning wafers 106 allows for greater precision, reduced time, and reduced cost as compared to current processes in fabricating sensor chip assemblies 102.

The illustration of sensor chip assembly fabrication system 100 in FIG. 1 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, other types of photodetectors 129 may be used in other illustrative examples in addition to or in place of avalanche photodiodes 133. For example, photodetectors 129 may include at least one of phototransistors, reversed biased light emitting diodes, photoresistors, or other suitable photodetectors.

As another illustrative example, photodetector wafer 120 may include other integrated circuits in addition to or in place of some integrated circuits in circuit wafer 121. For example, photodetector wafer 120 may include amplifiers, filters, or other suitable integrated circuits.

In yet another example, wafer stack 136 may include other wafers in addition to optics wafer 119, photodetector wafer 120, and circuit wafer 121. For example, an additional photodetector wafer and an additional optics wafer may be bonded to the other side of circuit wafer 121.

In FIGS. 2-7, illustrations of cross sections are shown to depict a process for fabricating sensor chip assemblies. The dimensions of the different cross sections shown are not to scale but are shown to illustrate the one illustrative example of a process for fabricating sensor chip assemblies. Also, not all of the steps performed in fabricating sensor chip assemblies are shown, to avoid obscuring the explanation features of the illustrative example.

Figure 2:
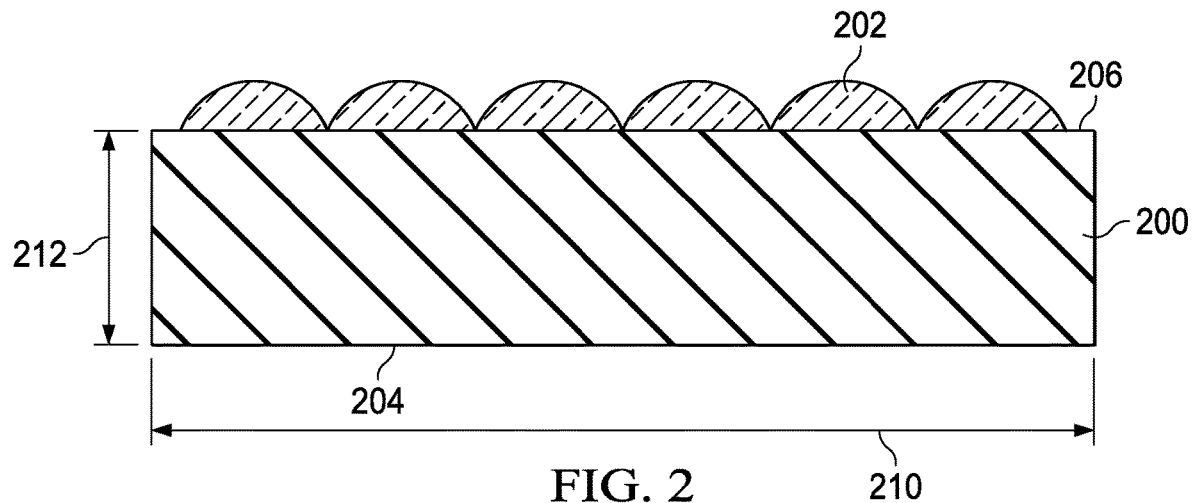
FIG. 2 is an illustration of a cross-sectional view of a microlens wafer in accordance with an illustrative example.

With reference first to FIG. 2, an illustration of a cross-sectional view of a microlens wafer is depicted in accordance with an illustrative example. As depicted, microlens wafer 200 is an example of optics wafer 119 shown in block form in FIG. 1. Microlens wafer 200 has microlenses 202 on the wafer. As depicted, microlenses 202 are formed in arrays.

Microlens wafer 200 has back side 204 and front side 206. Also, a group of alignment marks (not seen in this view) are present on microlens wafer 200.

In this illustrative example, microlens wafer 200 has diameter 210, which is about 100 millimeters in this example. Microlens wafer 200 has thickness 212. In this example, thickness 212 is about 200 micrometers. Diameter 210 of microlens wafer 200 may vary in different illustrative examples. For example, without limitation, microlens wafer 200 may be from about 25.4 millimeters to about 450 millimeters in diameter. Thickness 212 may be from about 100 micrometers to about 600 micrometers.

As depicted, microlens wafer 200 may be comprised of a number of different materials. For example, the material in microlens wafer 200 may be selected from one of GaP, fused silica, or some other suitable material that provides desired optical properties.

Figure 3:
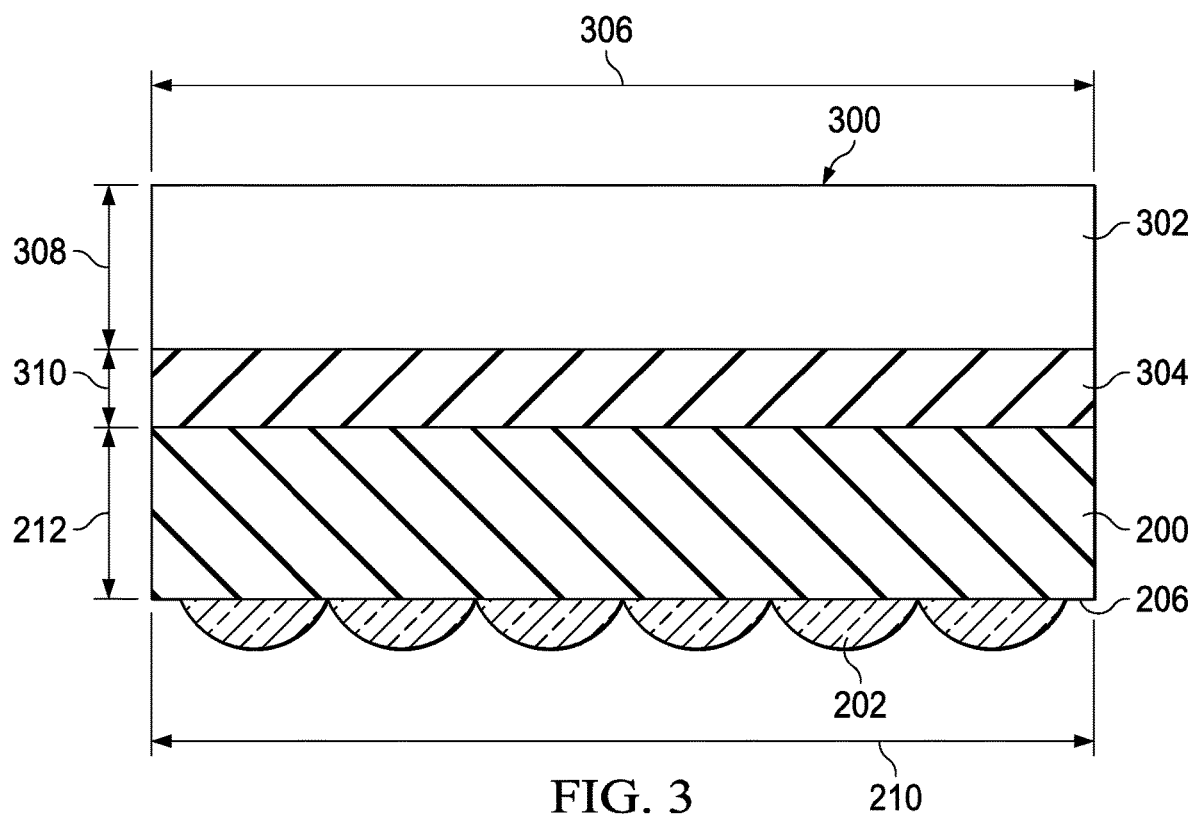
FIG. 3 is an illustration of a cross-sectional view of a microlens wafer bonded to a photodetector wafer in accordance with an illustrative example.

Turning to FIG. 3, an illustration of a cross-sectional view of a microlens wafer bonded to a photodetector wafer is depicted in accordance with an illustrative example. As depicted, photodetector wafer 300 is an example of photodetector wafer 120 shown in block form in FIG. 1. Photodetector wafer 300 has substrate 302 and epitaxial layer 304.

As depicted, photodetector wafer 300 and microlens wafer 200 are bonded to each other. In this illustrative example, photodetector wafer 300 and microlens wafer 200 may be bonded directly to each other or with a material such as epoxy, an adhesive, or other suitable materials. In particular, epitaxial layer 304 of photodetector wafer 300 is bonded to back side 204 of microlens wafer 200. In particular, the bonding material selected is a transparent bonding material in one illustrative example.

The bonding may be performed using a number of different bonding techniques for semiconductor processing. For example, the bonding of photodetector wafer 300 and microlens wafer 200 to each other may be performed using at least one of direct bonding, metal bonding, epoxy bonding, polymer bonding, or other suitable techniques.

In this illustrative example, photodetector wafer 300 has diameter 306, which is about the same as diameter 210 for microlens wafer 200. Substrate 302 has thickness 308, and epitaxial layer 304 has thickness 310. In the illustrative example, thickness 308 is about 325 micrometers, and thickness 310 is about 5 micrometers.

As depicted, substrate 302 may be comprised of a material selected from one of InP, GaAs, Ge, Si, or some other suitable material. Epitaxial layer 304 may be comprised of a material selected from one of InGaAs, InAlAs, InP, InAlGaAs, or some other suitable material.

Figure 4:
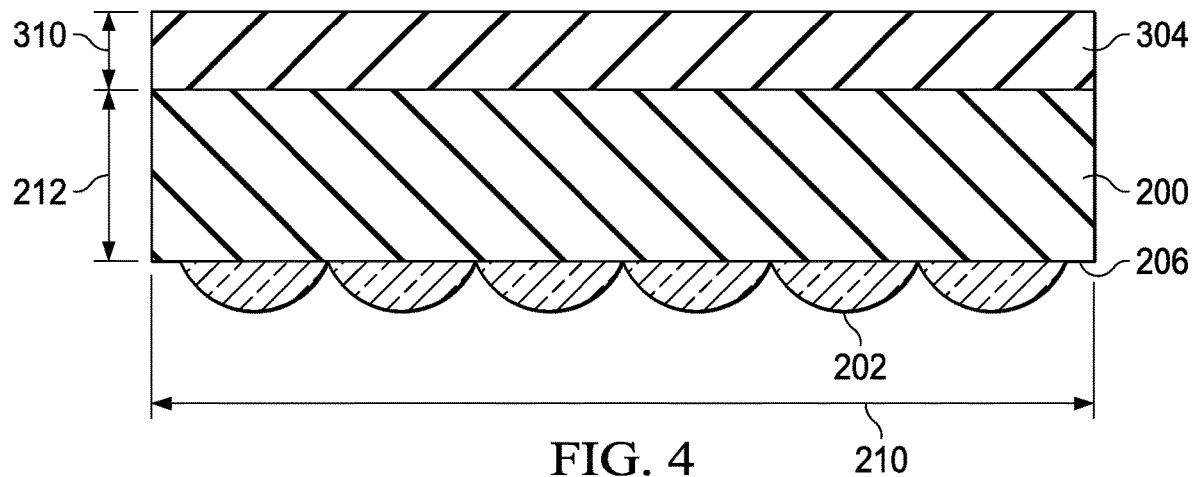
FIG. 4 is an illustration of a cross-sectional view of a microlens wafer bonded to a photodetector wafer in which a substrate has been removed in accordance with an illustrative example.

With reference next to FIG. 4, an illustration of a cross-sectional view of a microlens wafer bonded to a photodetector wafer in which a substrate has been removed is depicted in accordance with an illustrative example. In this illustrative example, substrate 302 of epitaxial layer 304 has been removed after photodetector wafer 300 and microlens wafer 200 have been bonded to each other.

As depicted, substrate 302 may be removed in a number of different ways. For example, substrate 302 may be removed using at least one of mechanical grinding, mechanical lapping, chemical etching, plasma etching, or some other suitable technique.

Figure 5:
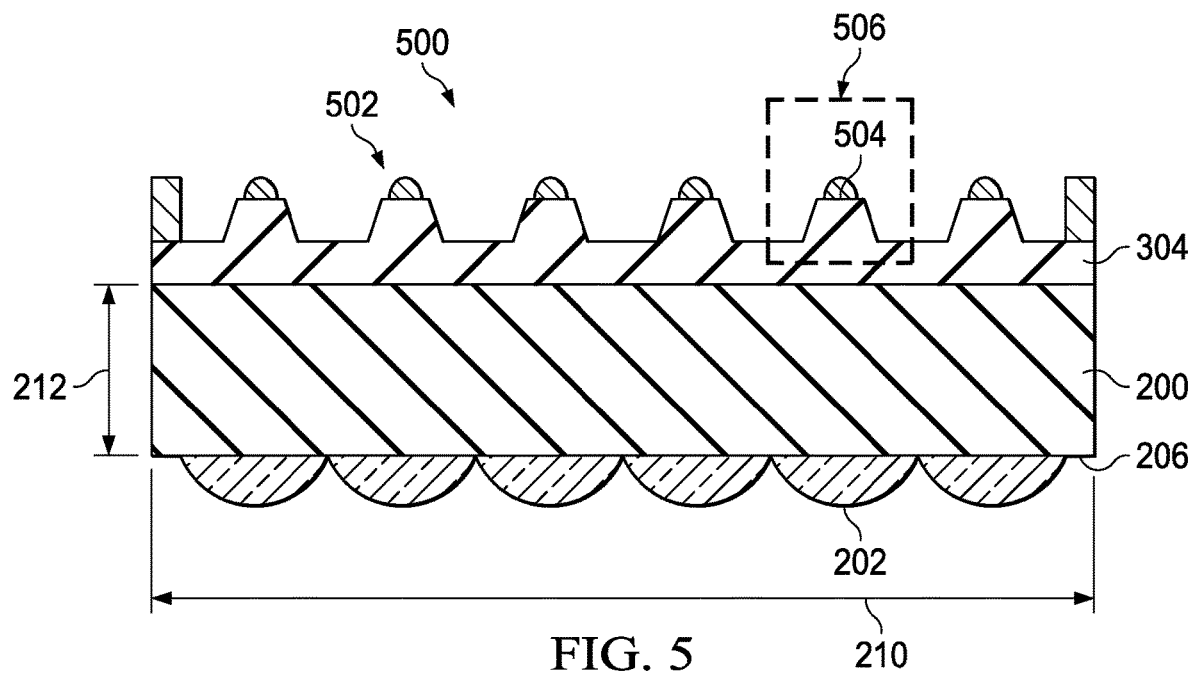
FIG. 5 is an illustration of a cross-sectional view of a microlens wafer bonded to a photodetector wafer with photodetectors in accordance with an illustrative example.

With reference next to FIG. 5, an illustration of a cross-sectional view of a microlens wafer bonded to a photodetector wafer with photodetectors is depicted in accordance with an illustrative example. As depicted in this example, photodetectors 500 have been formed on epitaxial layer 304 of photodetector wafer 300. Photodetectors 500 are formed in arrays.

In this illustrative example, photodetectors 500 are formed using alignment marks on microlens wafer 200. In other words, photodetectors 500 and corresponding microlenses 202 on microlens wafer 200 are aligned with each other by forming microlenses 202 in locations based on the alignment marks. In this example, the accuracy of the alignment between a photodetector in photodetectors 500 and a corresponding microlens in microlenses 202 is based on the accuracy of photolithography tools.

Figure 7:
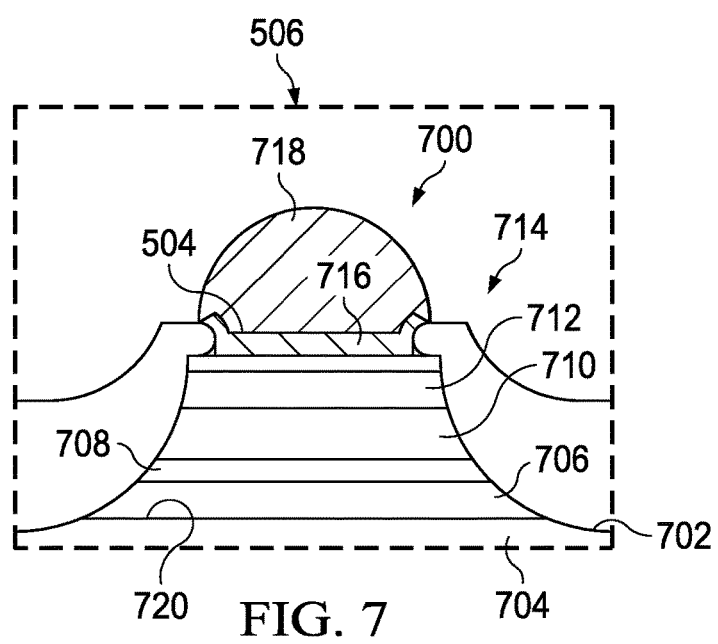
FIG. 7 is an illustration of a cross-sectional view of a photodetector in accordance with an illustrative embodiment.

Photodetectors 500 detect pixels for a sensor chip array. Each photodetector serves as a pixel in this illustrative example. In this manner, all of the pixels are aligned to microlenses 202. Bumps 502 are formed on photodetectors 500. Bumps 502 are structures that may be bonded to another structure, such as another bump on another wafer. A more detailed illustration of photodetector 504 in section 506 is shown in FIG. 7 and described below.

Figure 6:
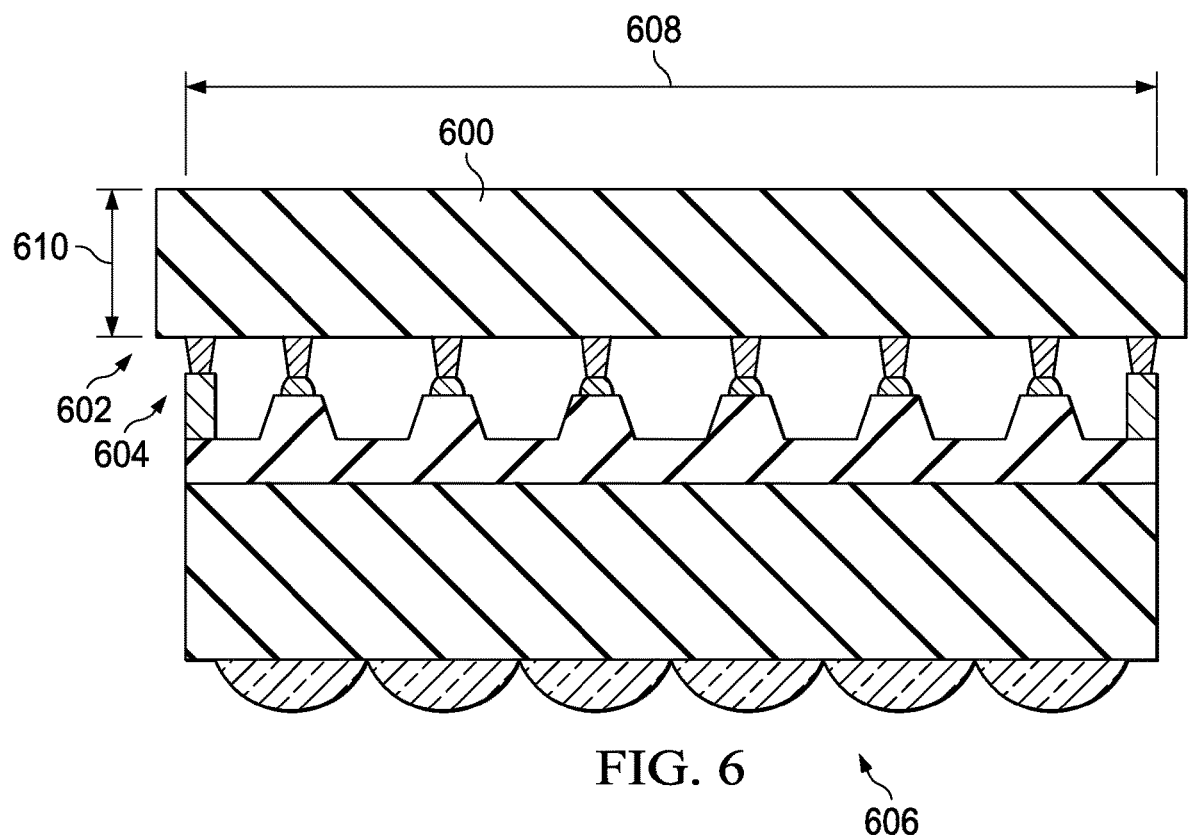
FIG. 6 is an illustration of a cross-sectional view of a photodetector wafer bonded to a readout integrated circuit wafer in accordance with an illustrative example.

With reference now to FIG. 6, an illustration of a cross-sectional view of a photodetector wafer bonded to a readout integrated circuit wafer is depicted in accordance with an illustrative example. In this figure, readout integrated circuit wafer 600 is an example of circuit wafer 121 shown in block form in FIG. 1. As depicted, readout integrated circuit wafer 600 has readout integrated circuits 602 that are connected to photodetectors 500 on photodetector wafer 300 shown in FIG. 5. The connections are made by bonding bumps 604 on readout integrated circuits 602 to bumps 502 in FIG. 5 on photodetectors 500. In this illustrative example, bumps 502 and bumps 604 may be comprised of Indium.

As depicted, readout integrated circuit wafer 600 has diameter 608 and thickness 610. Diameter 608 is about the same as diameter 210 for microlens wafer 200 and diameter 306 for photodetector wafer 300 shown in FIGS. 2 and 3. Thickness 610 is about 300 micrometers in this example.

As depicted, bumps 502 and bumps 604 may be formed by e-beam evaporation, sputtering, or plating with various metals. Examples of metals that may be used include Indium, AuSn, W, or other suitable materials. The bonding between readout integrated circuit wafer 600 and photodetector wafer 300 may be performed on a bonder or other suitable equipment. The alignment of photodetector wafer 300 and readout integrated circuit wafer 600 may be performed by at least one of aligning bumps 502 and bumps 604 with each other or using other alignment marks on the wafers.

In the illustrative example, the process shown in FIGS. 2-6 is an example of steps that may be implemented in photodetector fabrication process 116. This process bonds all three wafers. As depicted, microlens wafer 200, photodetector wafer 300, and readout integrated circuit wafer 600 are bonded to each other to form wafer stack 606. In another illustrative example, substrate 302 on photodetector wafer 300 may not be removed. The material, thickness 308, or both may be selected to pass a desired amount of light. In other words, substrate 302 is selected to be substantially transparent.

The bondings are all performed on a wafer level in this illustrative example. Wafer level alignment and bonding may be performed more accurately and more quickly than performing alignment and bonding on a die level.

With reference to FIG. 7, an illustration of a cross-sectional view of a photodetector is depicted in accordance with an illustrative embodiment. A more detailed view of photodetector 504 in section 506 from FIG. 5 is shown in this figure. In this illustrative example, photodetector 504 takes the form of avalanche photodetector 700. In particular, avalanche photodetector 700 is a mesa etched InP based Geiger mode avalanche photodetector.

As depicted, avalanche photodetector 700 has $p^+$ InP buffer 702 on substrate layer 704. Substrate layer 704 is epitaxial layer 304 in FIG. 4 and is an indium phosphide (InP) semiconductor in the illustrative example. Avalanche photodetector 700 also has InP multiplication layer 706, InP field stop layer 708, InGaAsP absorber 710, $n^+$ InP layer 712, contact 714, under bump metal 716, and indium bump 718. In this example, surface 720 of substrate layer 704 at the side of epitaxial layer 304 is farther away from substrate 302.

The illustration of cross sectional views of the wafers and the photodetectors in FIGS. 2-7 are not mean to limit the manner in which other illustrative examples may be implemented. For example, other types of semiconductors may be used in addition to in place of indium phosphate semiconductors. For example, silicon, gallium arsenide, indium gallium arsenide, and other suitable semiconductors may be used. Other wafer sizes and dimensions for semiconductor structures may be used.

As another illustrative example, other types of optical sensors may be used in placed of or in addition to avalanche photodetectors. For example, light sensitive transistor may be used. Also, FIGS. 2-7 show a mesa based photodetector as an illustrative example. Other configurations, such as, for example, planar photodetectors also may be used. Other types of photodetectors may also be used other than Geiger mode avalanche photodiodes. For example, the photodetectors may be linear mode avalanche photodiodes, PIN photodiodes, photoresistor, and other suitable types of photodetectors.

Figure 8:
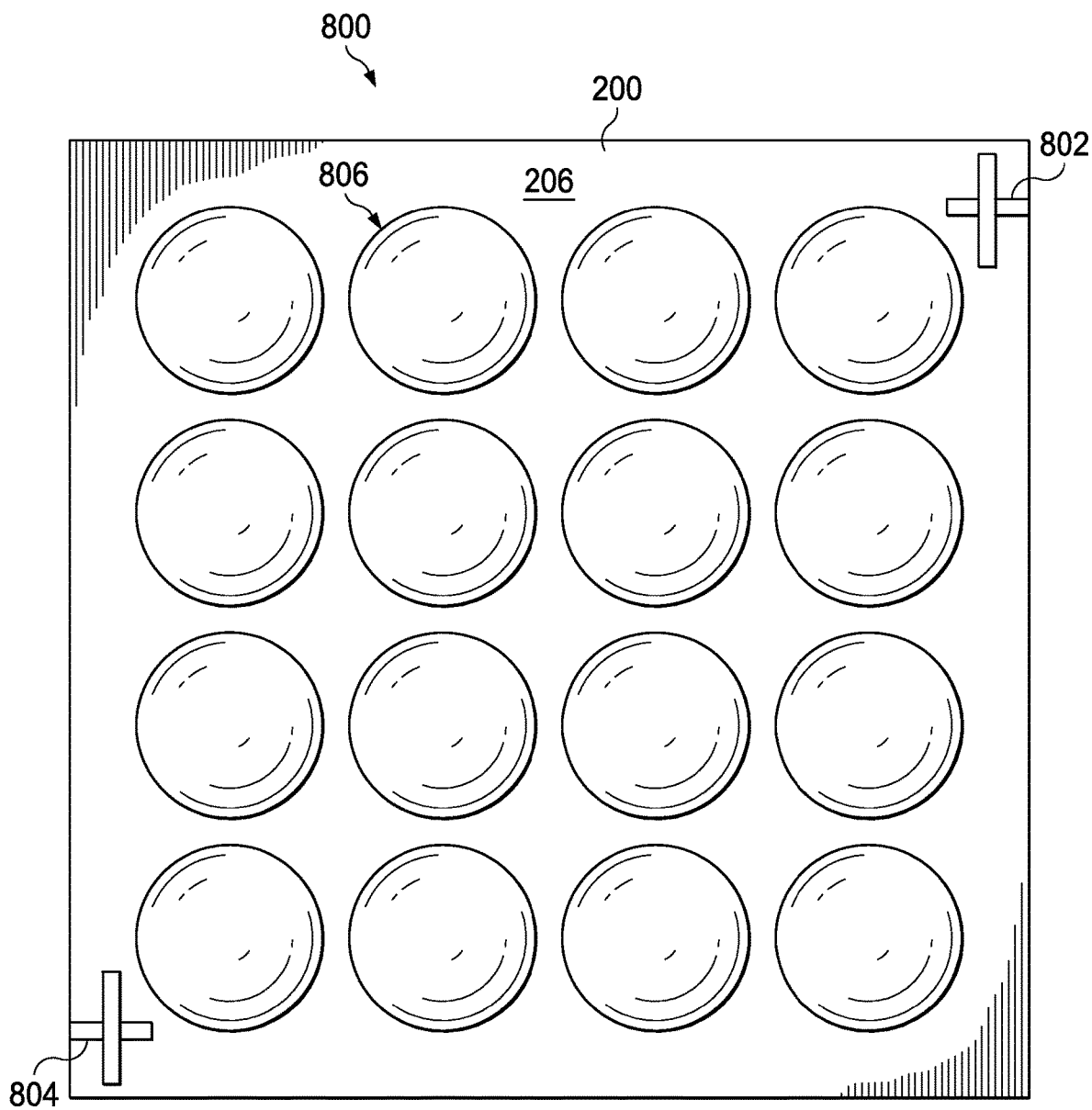
FIG. 8 is an illustration of a planar view of an optics wafer in accordance with an illustrative embodiment.

Turning next to FIG. 8, an illustration of a planar view of an optics wafer is depicted in accordance with an illustrative embodiment. A planar view of front side 206 of microlens wafer 200 is shown. In this illustrative example, a group of alignment marks 800 are seen in the planar view of microlens wafer 200. The group of alignment marks 800 include alignment mark 802 and alignment mark 804 in this depicted example. In this illustrative example, alignment mark 802 and alignment mark 804 are used to form photodetectors that are aligned with array of micro lenses 806.

In this illustrative example, the group of alignment marks 800 may be formed in a number of different ways. For example, the group of alignment marks 800 may be formed using patterned metal. In another illustrative example, the group of alignment marks 800 may be formed using a laser or other suitable device.

The different components shown in FIGS. 2-8 may be combined with components in FIG. 1, used with components in FIG. 1, or a combination of the two. Additionally, some of the components in FIGS. 2-8 may be illustrative examples of how components shown in block form in FIG. 1 can be implemented as physical structures.

Figure 9:
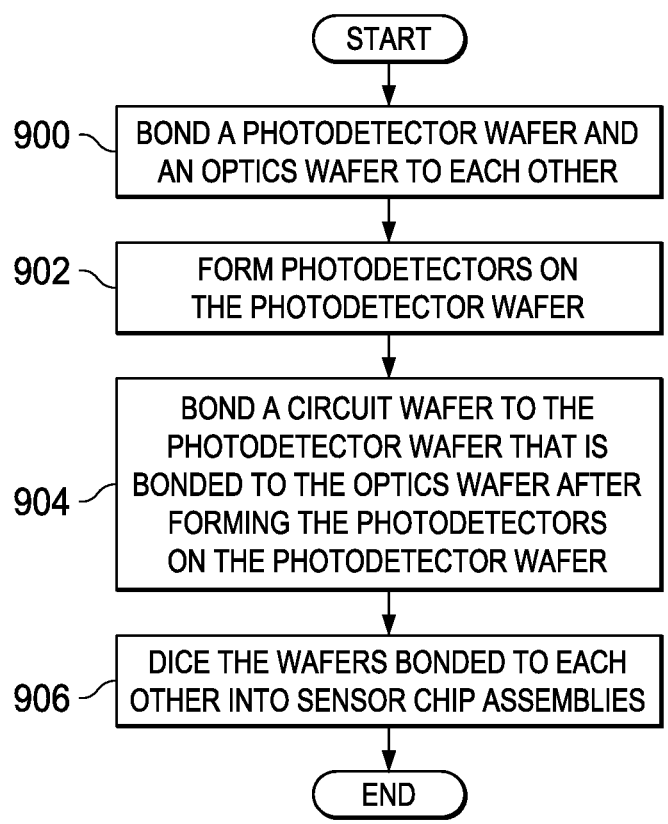
FIG. 9 is an illustration of a flowchart of a high level process for fabricating sensor chip assemblies in accordance with an illustrative embodiment.

With reference next to FIG. 9, an illustration of a flowchart of a high level process for fabricating sensor chip assemblies is depicted in accordance with an illustrative embodiment. The process illustrated in FIG. 9 may be implemented in sensor chip assembly fabrication system 100 in FIG. 1. The process may be implemented as part of photodetector fabrication process 116 using semiconductor fabrication equipment 108 in FIG. 1.

The process begins by bonding a photodetector wafer and an optics wafer to each other (operation 900). The process then forms photodetectors on the photodetector wafer (operation 902). The process then bonds a circuit wafer to the photodetector wafer that is bonded to the optics wafer after forming the photodetectors on the photodetector wafer (operation 904). The process then dices the wafers bonded to each other into sensor chip assemblies (operation 906), with the process terminating thereafter.

Figure 10:
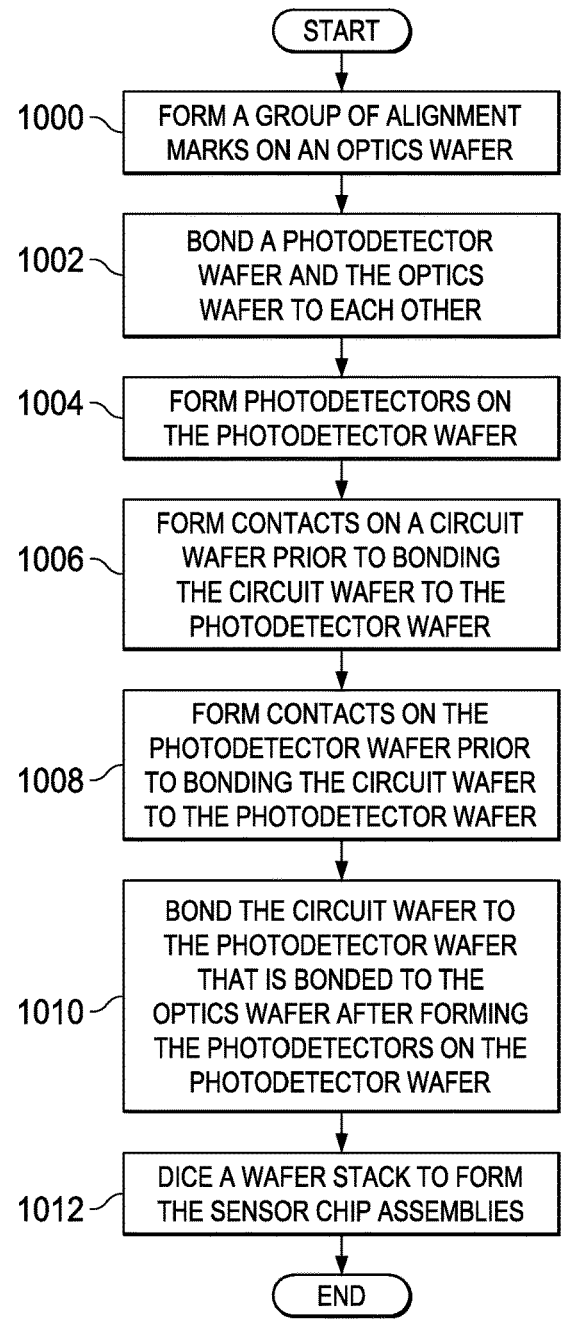
FIG. 10 is an illustration of a flowchart of a process for fabricating sensor chip assemblies in accordance with an illustrative embodiment.

Turning next to FIG. 10, an illustration of a flowchart of a process for fabricating sensor chip assemblies is depicted in accordance with an illustrative embodiment. The process illustrated in FIG. 10 may be implemented in sensor chip assembly fabrication system 100 in FIG. 1. The process may be implemented as part of photodetector fabrication process 116 using semiconductor fabrication equipment 108 in FIG. 1.

The process begins by forming a group of alignment marks on an optics wafer (operation 1000). The process then bonds a photodetector wafer and the optics wafer to each other (operation 1002). The process then forms photodetectors on the photodetector wafer (operation 1004). The photodetectors in operation 1004 are formed using the group of alignment marks. In this manner, allowing the formation of photodetectors is performed on a wafer level. Alignment of dies for microlenses and photodetectors to each other may be avoided in an illustrative example.

The process forms contacts on a circuit wafer prior to bonding the circuit wafer to the photodetector wafer (operation 1006). The process also forms contacts on the photodetector wafer prior to bonding the circuit wafer to the photodetector wafer (operation 1008). In operation 1006 and operation 1008, the contacts may be bumps that are bonded to each other.

The process then bonds the circuit wafer to the photodetector wafer that is bonded to the optics wafer after forming the photodetectors on the photodetector wafer (operation 1010). In operation 1010, the circuit wafer bonded to the photodetector wafer that is bonded to the photodetector wafer forms a wafer stack. The process then dices a wafer stack to form the sensor chip assemblies (operation 1012), with the process terminating thereafter.

Figure 11:
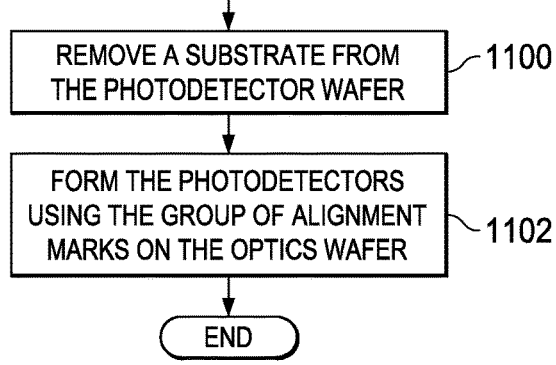
FIG. 11 is an illustration of a flowchart of a process for forming photodetectors on a photodetector wafer in accordance with an illustrative embodiment.

Turning next to FIG. 11, an illustration of a flowchart of a process for forming photodetectors on a photodetector wafer is depicted in accordance with an illustrative embodiment. The process in FIG. 11 is an example of an implementation for operation 1004 in FIG. 10.

The process begins by removing a substrate from the photodetector wafer (operation 1100). In operation 1100 an epitaxial layer remains after removing the substrate from the photodetector wafer.

The process then forms the photodetectors using the group of alignment marks on the optics wafer (operation 1102). The process terminates thereafter.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

For example, operation 1004 and operation 1006 may be performed in reverse order. Alternatively, operation 1004 and operation 1006 may be performed at substantially the same time. In another example, operation 1000 in which the group of alignment marks is formed may be performed after operation 1002.

The different operations may be performed using semiconductor fabrication equipment 108. This equipment may be in control of a controller of such as computer, processor, or other hardware device. As illustrated, the operator may operate equipment in place of or in conjunction with the controller.

In another example, in FIG. 10, operation 1000 may be omitted. The photodetectors may be formed using the group of alignment marks on the optics wafer without removing the substrate from the photodetector wafer.

The illustrative embodiments provide a method for fabricating sensor chip assemblies. The process described in the illustrative examples provide for alignment and bonding on a wafer level rather than on a die level. As a result, the time and effort needed to fabricate dies may be reduced. For example, a 100 millimeter wafer with 10 millimeter dies may yield 48 dies. Aligning on a wafer level involves one alignment operation between the optics wafer and the photodetector wafer as compared to 48 alignment operations for the 48 dies. With a 300 millimeter wafer, 600 dies may be obtained in this example that result in 600 alignment operations on the die instead of one alignment operation on the wafer level.

Additionally, performing alignments on a wafer level may be more accurate than on a die level. This situation is especially true when the die becomes smaller in size and as the pitch of pixels in photodetectors become smaller and smaller. With an illustrative embodiment, active alignments may be avoided.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method comprising:

forming an optics wafer comprising an array of lenses disposed on a first side of a first wafer, the first wafer also having a second side opposite the first side;

forming a photodetector wafer comprising a second wafer having a substrate layer adjacent an epitaxial layer, the epitaxial layer having a third side facing the substrate layer and a fourth side opposite the third side;

bonding the photodetector wafer and the optics wafer to each other by bonding the fourth side of the epitaxial layer to the second side of the first wafer;

after bonding, forming alignment marks on the first side of the first wafer;

after bonding, removing the substrate layer to expose the third side of the epitaxial layer;

after removing the substrate layer, forming photodetectors on the third side of the epitaxial layer of the photodetector wafer using the alignment marks on the optics wafer in order to align the photodetectors with the array of lenses, wherein each photodetector serves as a pixel aligned with each lens; and after forming the photodetectors, bonding a circuit wafer to the photodetector wafer, wherein together the optics wafer, the photodetector wafer, and the circuit wafer form a wafer stack.

2. The method of claim 1, further comprising:

dicing the wafer stack to form sensor chip assemblies.

3. The method of claim 1 further comprising:

forming contacts on the circuit wafer prior to bonding the circuit wafer to the photodetector wafer; and forming contacts on the photodetector wafer prior to bonding the circuit wafer to the photodetector wafer.

4. The method of claim 1 further comprising:
forming the alignment marks on the optics wafer using photolithography.

5. The method of claim 1, wherein removing the substrate layer is performed by mechanical grinding.

6. The method of claim 1, wherein removing the substrate layer is performed by mechanical lapping.

7. The method of claim 1, wherein removing the substrate layer comprises chemical etching.

8. The method of claim 7, wherein removing the substrate layer comprises plasma etching.

9. The method of claim 1, wherein the circuit wafer is a readout integrated circuit wafer.

10. The method of claim 1, wherein the photodetectors are avalanche photodiodes.

11. A method for fabricating sensor chip assemblies, the method comprising:
bonding an avalanche photodiode wafer and an optics wafer to each other, wherein the optics wafer comprises an array of lenses disposed on a first side opposite the photodiode wafer;
after bonding the avalanche photodiode wafer and the optics wafer to each other, forming a group of alignment marks on the first side of the optics wafer;
forming arrays of avalanche photodiodes on the avalanche photodiode wafer using the group of alignment marks on the optics wafer, wherein each photodetector serves as a pixel aligned with each lens;
forming contacts on a readout integrated circuit wafer;
forming contacts on the avalanche photodiode wafer;
bonding the readout integrated circuit wafer to the avalanche photodiode wafer that is bonded to the optics wafer after forming the arrays of avalanche photodiodes on the avalanche photodiode wafer to form a wafer stack; and
dicing the wafer stack to form individual dies for the sensor chip assemblies.

12. The method of claim 11, wherein the step of forming the arrays of avalanche photodiodes on the avalanche photodiode wafer comprises:
removing a substrate from the avalanche photodiode wafer; and
forming the arrays of avalanche photodiodes using the group of alignment marks on the optics wafer.

13. The method of claim 12, wherein the step of removing the substrate from the avalanche photodiode wafer comprises:
performing at least one of mechanical grinding, mechanical lapping, chemical etching, or plasma etching to remove the substrate from the avalanche photodiode wafer.

14. The method of claim 12, wherein an epitaxial layer remains after removing the substrate.

15. The method of claim 11, wherein the optics wafer includes arrays of microlenses with diameters of less than a millimeter each.

* * * * *